United States Patent
Banin et al.

(10) Patent No.: US 10,181,856 B2
(45) Date of Patent: Jan. 15, 2019

(54) DIGITAL PHASE LOCKED LOOP FREQUENCY ESTIMATION

(71) Applicant: Intel IP Corporation, Santa Clara, CA (US)

(72) Inventors: Elan Banin, Raanana (IL); Roy Amel, Haifa (IL); Ran Shimon, Ramat Gan (IL); Ashoke Ravi, Hillsboro, OR (US); Nati Dinur, Haifa (IL)

(73) Assignee: Intel IP Corporation, Santa Clara, CA (US)

(*) Notice: Subject to any disclaimer, the term of this patent is extended or adjusted under 35 U.S.C. 154(b) by 0 days.

(21) Appl. No.: 15/395,504

(22) Filed: Dec. 30, 2016

(65) Prior Publication Data

US 2018/0191489 A1    Jul. 5, 2018

(51) Int. Cl.
*H03L 7/08* (2006.01)
*H04L 27/00* (2006.01)
*H03L 7/085* (2006.01)

(52) U.S. Cl.
CPC .............. *H03L 7/08* (2013.01); *H03L 7/085* (2013.01); *H04L 27/0014* (2013.01); *H04L 2027/0053* (2013.01); *H04L 2027/0067* (2013.01)

(58) Field of Classification Search
CPC ... H03L 7/085; H03L 7/00; H03L 7/06; H03L 7/08; H03L 7/16
See application file for complete search history.

(56) References Cited

U.S. PATENT DOCUMENTS

| | | |
|---|---|---|
| 2002/0159539 A1 | 10/2002 | Alcock et al. |
| 2007/0035345 A1 | 2/2007 | Siddall |
| 2008/0304609 A1 | 12/2008 | Losic |
| 2010/0310031 A1 | 12/2010 | Ballantyne et al. |
| 2011/0050998 A1 | 3/2011 | Gao et al. |
| 2013/0214834 A1 | 8/2013 | Wen |
| 2013/0321051 A1* | 12/2013 | Sonntag ............. H03L 7/085 327/159 |
| 2014/0210532 A1 | 7/2014 | Jenkins |
| 2015/0145570 A1 | 5/2015 | Perrott |
| 2016/0204787 A1* | 7/2016 | Lotfy ................. H03L 7/085 327/142 |
| 2016/0322980 A1 | 11/2016 | Xu et al. |

FOREIGN PATENT DOCUMENTS

EP        2999121        3/2016

OTHER PUBLICATIONS

Search Report dated Dec. 18, 2017 for International Application No. PCT/US2017/056351.

* cited by examiner

*Primary Examiner* — Betsy L Deppe
(74) *Attorney, Agent, or Firm* — Schiff Hardin LLP

(57) ABSTRACT

A Digital Phase Locked Loop (DPLL), including a Time-to-Digital Converter (TDC) configured generate quantized phase values of a Voltage Controlled Oscillator (VCO) signal; and a frequency estimation circuit configured to receive the quantized phase values, determine wraparound phase of the quantized phase values, and least-squares estimate a frequency based on the quantized phase values and the wraparound phase.

23 Claims, 3 Drawing Sheets

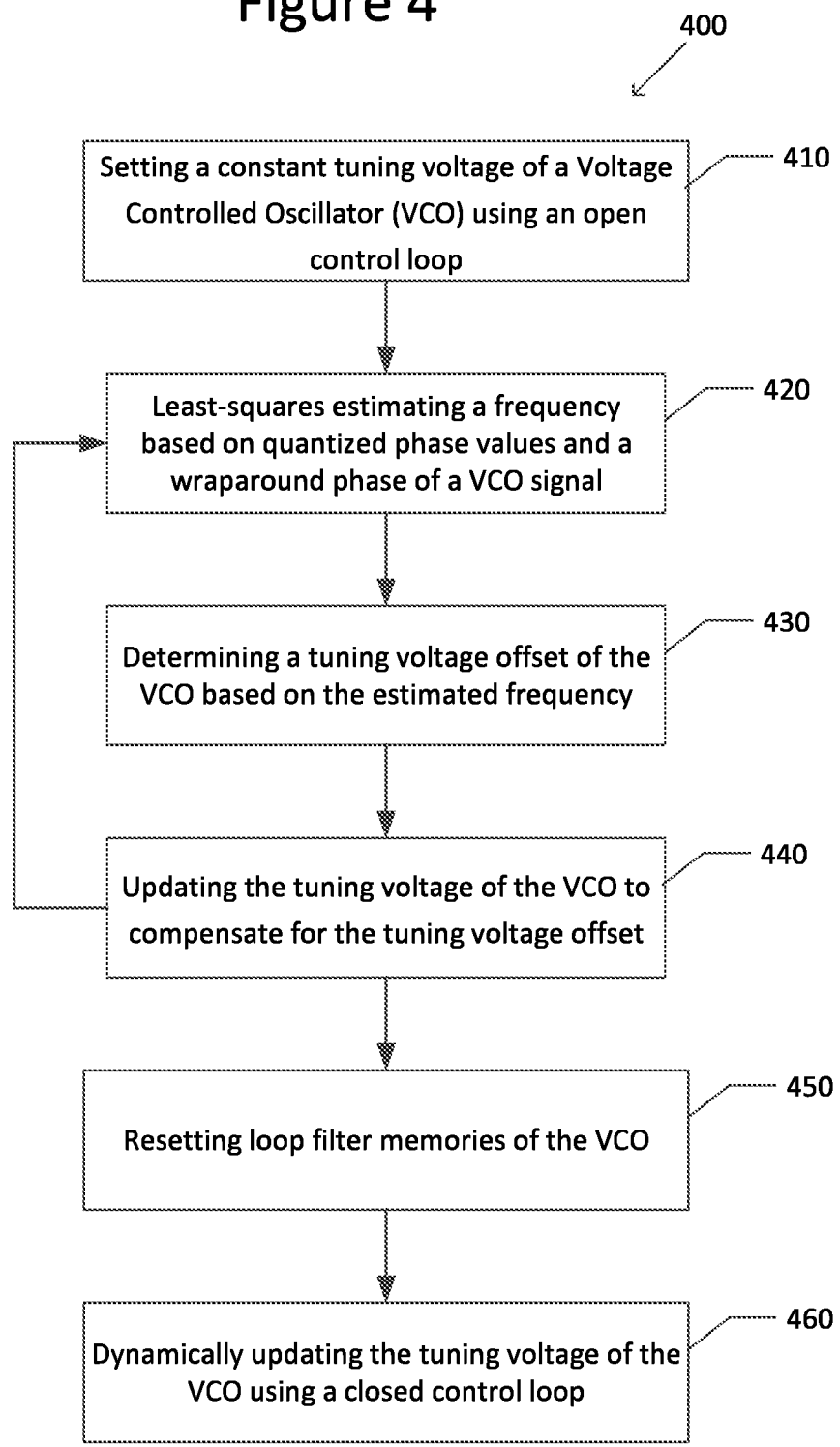

DIGITAL PHASE LOCKED LOOP FREQUENCY ESTIMATION

TECHNICAL FIELD

The present disclosure relates to frequency estimation in a Digital Phase Locked Loop (DPLL).

BACKGROUND

Digital Phase Locked Loops (DPLLs) provide a low-power, small-area solution relative to analog PLLs. In a DPLL, a phase offset between a Voltage Controlled Oscillator (VCO) and a reference clock is measured by a Time-to-Digital Convertor (TDC). The measured phase is then compared with a required phase, and the result is used to correct the VCO frequency. Even though the DPLL is a phase-locked loop, knowing the frequency would be useful for many functions, such as fast PLL locking and band calibration.

BRIEF DESCRIPTION OF THE DRAWINGS

FIG. 4 illustrates a flowchart 400 of an exemplary method of DPLL fast locking using the frequency estimation circuit of FIG. 3.

DESCRIPTION OF THE ASPECTS

The present disclosure is directed to a faster frequency estimation in a Digital Phase Locked Loop (DPLL). The digital domain of the PLL allows implementation of Least-Square (LS) estimation for maximum accuracy based on a minimum number of samples. More specifically, a frequency estimation circuit configured to receive quantized phase values of a Voltage Controlled Oscillator (VCO) signal, determine wraparound phase of the quantized phase values, and least-squares estimate a frequency based on the quantized phase values and the wraparound phase.

Figure 1:
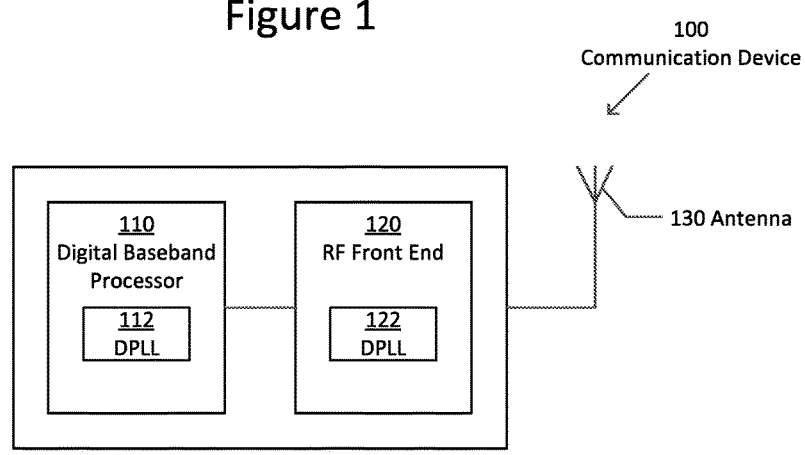
FIG. 1 illustrates a communication device comprising an exemplary DPLL in accordance with an exemplary aspect of the disclosure.

FIG. 1 illustrates a communication device 100 comprising an exemplary DPLL in accordance with an aspect of the disclosure. The communication device 100 may comprise, for example, a tablet computer, a netbook, a notebook computer, a laptop computer, mobile phone, a cellular phone, a smartphone, a personal digital assistant, a multimedia playback device, a digital music player, a digital video player, a navigational device, a digital camera, or the like.

The communication device 100 comprises a digital baseband processor 110, a Radio Frequency (RF) front end 120, and an antenna 130, among other elements not shown. The digital baseband processor 110 may comprise an exemplary DPLL 112. Similarly, the RF front end 120 may comprise an exemplary DPLL 122. The RF front end 120 is coupled between the digital baseband processor 110 and the antenna 130.

Figure 2:
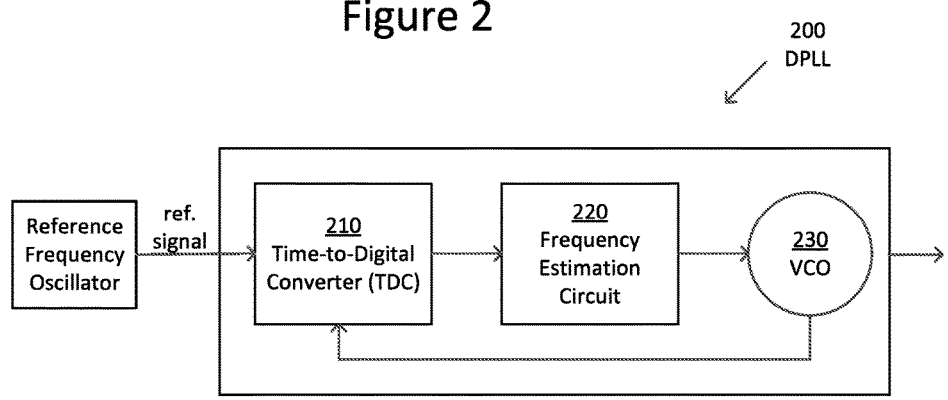
FIG. 2 illustrates a DPLL in accordance with an exemplary aspect of the disclosure.

FIG. 2 illustrates a DPLL 200 in accordance with an exemplary aspect of the disclosure.

The DPLL 200 may be configured to generate an output signal whose phase is related to the phase of the input signal. A particular application of this, for example, is with regard to tuning to different carrier frequencies during communication between communication devices 100.

The DPLL 200 comprises a Time-to-Digital Converter (TDC) 210, a frequency estimation circuit 220, and a Voltage Controlled Oscillator (VCO) 230.

The TDC 210 is configured to measure time intervals of a signal of the VCO 230 and generate quantized phase values. In a closed-loop control scenario, the TDC 210 is configured to receive a reference signal from a reference frequency oscillator and a feedback signal from the VCO 230; the TDC 210 measure a times difference between the reference signal and the feedback signal.

The frequency estimation circuit 220 is configured to receive the quantized phase values from the TDC 210. The quantized phase values have a modulo nature, that is, wraparound phase.

The TDC 210 samples the phase of the VCO signal every clock cycle of a reference frequency oscillator. For any reference frequency (e.g., 80 MHz), if the VCO frequency is an integer multiplication of it (e.g., 8 GHz=100*80 MHz),—at every sample this is a constant phase; so the VCO signal frequency is 100 times the reference frequency. On the other hand, if the frequency of the VCO signal is a fraction (e.g., 8.008 GHz=100.1*80 MHz), than for each successive sample there is a phase increase of 10%. This phase increase of 10% can be translated into an estimated frequency offset. The frequency estimation circuit 220 measures the phase ramp, that is, how much the phase changes, and determines the VCO frequency based on this phase ramp. If the phase is linear line, the only difference in phase is that it wraps around every cycle (i.e., $2\pi$).

The frequency estimation circuit 220 is further configured to determine the wraparound phase of the quantized phase values, and then least-squares estimate a frequency based on the quantized phase values and the wraparound phase. The frequency estimation is performed in an open loop. The frequency is a slope of the quantized phase values, or samples, and thus least-squares estimation can be applied to the quantized phase values to determine the frequency.

Again, the TDC 210 is configured to measure the VCO phase. The units of the measured phase are not radians. The units are relative to a period, and a period is defined as the TDC value which matches a full cycle ($2\pi$).

A constant frequency corresponds with a linear-phase in accordance with:

$$\varphi_k = \varphi_0 + f \cdot k, \quad \text{(Equation 1)}$$

where $\varphi_k$ is a phase at sample k in radians, $\varphi_0$ is an unknown starting phase in radians, f is the frequency to be estimated, and k is an index of the sample. The phase is measured in radian due to the characteristics of the TDC 210.

As mentioned above, the phase is observed in units relative to a period of the VCO signal. Equation 1, which is in radians, may be converted to periods, as represented as:

$$\theta_k = \theta_0 + f \cdot P \cdot k, \quad \text{(Equation 2)}$$

where $\theta_k$ is a phase at quantized phase value (sample) k, $\theta_0$ is an unknown starting phase, and P is a threshold proportional to a period of the VCO signal. A period P represents $2\pi$, that is, a full cycle. The difference between Equation 1 (with $\varphi_k$) and Equation 2 (with $\theta_k$), respectively, is the units.

When noise $\varepsilon_k$ is added, the observed phase at sample k, without modulo (i.e., wraparound phase), is:

$$y_k = \theta_0 + f \cdot P \cdot k + \varepsilon_k, \text{ for } k=1 \ldots N. \quad \text{(Equation 3)}$$

Due to a limited dynamic range of the TDC 210, the phase ramp has modulo, that is, wraparound phase ramp. This is because the TDC 210 can only measure the phase between 0 and $2\pi$ (a period). The observed phase $\tilde{y}_k$ at sample k with modulo or wraparound phase of the VCO 230 is observed as follows:

$$\tilde{y}_k := \mathrm{mod}(\theta_0 + f \cdot P \cdot k + \varepsilon_k, P), \text{ for } k=1 \ldots N. \quad \text{(Equation 4)}$$

As mentioned above, the frequency f is the slope of the phase. If the noise is Gaussian and independent and identically distributed, there is a known Least-Squares (LS)/Maximum Likelihood solution for determining the estimated frequency $\hat{f}$:

$$\hat{f}_{LS} := \underbrace{[A^T \cdot A]^{-1} \cdot A^T}_{B} \cdot y, \quad \text{(Equation 5)}$$

$$\text{where } A := \begin{bmatrix} 1 & 1 \\ \vdots & \vdots \\ 1 & N \end{bmatrix}, \quad y := \begin{bmatrix} y_1 \\ \vdots \\ y_N \end{bmatrix},$$

$A^T$ is the transverse of matrix A, and B is a predefined matrix. B in the equation is defined by what is above it, that is, $[A^T \cdot A]^{-1} \cdot A^T$. A is predefined, and thus B is known.

The second term of the 2×1 vector B·y is the estimated frequency y. For implementation purposes, only the second term of the predefined matrix B is used, and can be stored in a memory (e.g., ROM); this is a 1×N vector. The multiplication is performed term-by-term, meaning that there is no need to buffer each of the samples/quantized values; only an accumulated value needs to be stored after each sample.

Described above is the classic solution, but it does not take into consideration modulo/wraparound phase. Due to wraparound phase, the actual observed phase with modulo is:

$$\tilde{y}_k := \mathrm{mod}(\theta_0 + f \cdot P \cdot k + \varepsilon_k, P). \quad \text{(Equation 6)}$$

Equation 6 may alternatively be written as:

$$\tilde{y}_k := \theta_0 + f \cdot P \cdot k + \varepsilon_k - L_k \cdot P, \quad \text{(Equation 7)}$$

where L is a number of wraparounds. It is easy to detect the wraparounds with accuracy by comparing a difference between a currently observed quantized phase value $\varphi_k$ and a previous quantized phase value $\varphi_{k-1}$ with an expected frequency $f_{exp}$. Counting these occurrences produces L as follows:

$$L_l = \begin{cases} -1, & (\varphi_k - \varphi_{k-1}) - f_{exp} < -P/2 \\ 0, & \text{else} \\ 1, & (\varphi_k - \varphi_{k-1}) - f_{exp} > P/2 \end{cases}, \quad L = \sum_{l=1}^{k} L_l. \quad \text{(Equation 8)}$$

The phase $y_k$ can be broken into two parts:

$$y_k = \tilde{y}_k + L_k \cdot P, \quad \text{(Equation 9)}$$

where $y_k$ is the observed phase without modulo/wraparound phase, $\tilde{y}_k$ is the observed phase with modulo/wraparound phase, and $L_k \cdot P$ is the modulo wraparound phase. Once wraparound-counter L is determined, and period P is known, then the phase without the modulo/wraparound phase can be determined; then the classic solution for $\hat{f}_{LS}$ described above can be used.

Thus, the estimated frequency $\hat{f}$, which eliminates the modulo/wraparound phase, is:

$$\hat{f} = b_2 * y_k = b_2 * \tilde{y}_k + b_2 * (L_k \cdot P), \quad \text{(Equation 10)}$$

where $b_2$ is a second column of the matrix B. Matrix B has two vectors, one vector $b_1$ to estimate the initial phase, and the other vector $b_2$ to estimate the phase ramp, which is the frequency. This calculation can be done on a sample-by-sample basis without a need to store each of the samples; only an accumulated value needs to be stored after each sample. Also, the multiplication of the second term by period P can be done at the end of the calculations. In such a case where period P needs to be estimated, this estimation can be done in parallel to the calculations. Only a coarse initial estimation of period P is needed for calculating a number of wraparounds L, as described above.

Figure 3:
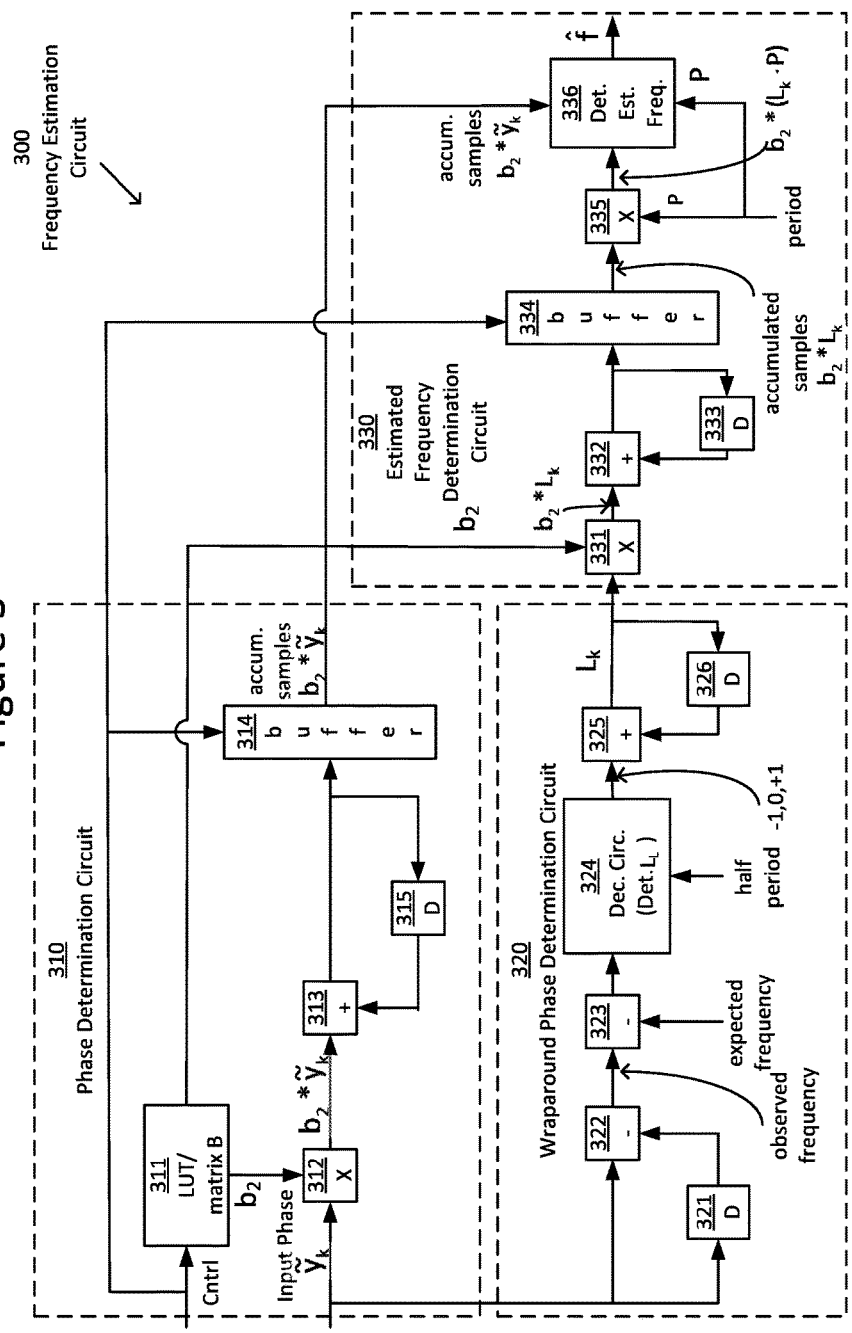
FIG. 3 illustrates a frequency estimation circuit in accordance with an exemplary aspect of the disclosure.

FIG. 3 illustrates an exemplary frequency estimation circuit 300 to implement the frequency estimation described above. This frequency estimation circuit 300 is an example of the frequency estimation circuit 220 of FIG. 2.

The frequency estimation circuit 300 comprises a phase determination circuit 310, a wraparound phase determination circuit 320, and an estimated frequency determination circuit 330.

The phase determination circuit 310 is configured to determine an accumulation of the quantized phase values/samples $b_2 * \tilde{y}_k$ including the wraparound phase. The phase determination circuit 310 comprises a Look-Up-Table (LUT) or matrix B 311, a multiplier 312, an accumulator 313, an accumulated samples buffer 314, and a delay 315.

The multiplier 312 is configured to multiply the observed input phase $\tilde{y}_k$ by a second vector $b_2$ of matrix B, and output the product $b_2 * \tilde{y}_k$, which is the phase ramp or frequency, which includes modulo or wraparound phase. Regarding the notation, the "*" symbol is a multiplication operation of a vector by a vector on a sample-by-sample basis.

The accumulator 313 and the delay 315 are configured to perform cumulative-summation of the output values $b_2 * \tilde{y}_k$. The accumulated total is then stored in buffer 314; this result is the first portion of Equation 10 above. As previously mentioned, it is not necessary to store individuals ones of the samples, only the accumulated result.

The wraparound phase determination circuit 320 is configured to determine the wraparound phase of the quantized phase values. The wraparound phase determination circuit 320 comprises a delay 321, a derivative 322, a subtractor 323, decision circuit 324, an accumulator 325, and a delay 326.

The derivative 322 is configured to determine a derivative of the observed input phase $\tilde{y}_k$ using the current observed phase and a previously observed input phase $\tilde{y}_{k-1}$ received from the delay 321, to determine the ramp of the input phase $\tilde{y}_k$. In other words, the derivative 322 is configured to determine the observed frequency ($\varphi_k - \varphi_{k-1}$, as in Equation 8 above).

The subtractor 323 is configured to subtract an expected frequency from the observed frequency received from the derivative 322, as in Equation 8 discussed above, and output a result to the decision circuit 324.

The decision circuit 324 is configured to compare the result from the subtractor 323 with a half period P/2, as in Equation 8 discussed above. If the subtractor 323 result is less than −P/2, then the current value of the wraparound $L_l$ is −1. On the other hand, if the subtractor 323 result is greater than P/2, then the current value of the wraparound $L_l$ is 1. Otherwise, there is no wraparound in either the positive or negative direction, and the current value of $L_l$ is 0. The value of the period P here does not need to be accurate, and may instead be estimated roughly.

The accumulator 325 and the delay 326 are configured to perform cumulative-summation of the wraparound values $L_l$ for each of the samples, and output the accumulated wraparound values $L_k$.

The estimated frequency determination circuit 330 is configured to determine the estimated frequency by removing the wraparound phase $L_k$ from the quantized phase values $b_2*\tilde{y}_k$. The estimated frequency determination circuit 330 comprises a multiplier 331, an accumulator 332, a delay 333, an accumulated wraparound values buffer 334, a multiplier 335, and an estimated frequency determiner 336.

The multiplier 331 is configured to multiply the accumulated wraparound values $L_k$ of quantized phase value k by the second vector $b_2$ of matrix B, and output result $b_2*L_k$.

The accumulator 332 and the delay 333 are configured to perform cumulative-summation of the output values $b_2*L_k$, and then store the accumulated total in the accumulated wraparound values buffer 334. The delay 333 configured to merely provide the accumulator 332 with time to perform its functions.

The multiplier 335 is configured to multiple the accumulated wraparound values $b_2*L_k$ by the period P and output the result; this result is the second portion of Equation 10 above $b_2*(L_k \cdot P)$. The period P may be estimated in parallel to the calculations of the quantized phase values, and then used with the multiplier 335. The value of P used with the determination circuit 324 earlier in the process is not need to be accurate, and thus a rough estimate was sufficient. For this multiplication by multiplier 335, the value of the period P may be more accurately estimated.

Finally, the estimated frequency determiner 336 is configured to combine the multiplier 335 output $b_2*(L_k \cdot P)$ with the accumulated samples output $b_2*\tilde{y}_k$ from sample buffer 314, as in Equation 10 above, to determine an estimated frequency $\hat{f}$ which has the modulo/wraparound taken into consideration. The estimated frequency determiner 336 is also configured to translate the units of the estimated frequency $\hat{f}$ as necessary.

FIG. 4 illustrates a flowchart 400 of a method of DPLL fast locking using the frequency estimation circuit 300 of FIG. 3.

In Step 410, a constant tuning voltage, V-tune, of a VCO 230 is set using an open control loop. An open control loop is when there is no feedback control loop with an error to correct an offset of the tuning voltage V-tune.

In Step 420, a frequency is least-squares estimated based on quantized phase values and a wraparound phase of a VCO signal, as described above with respect to FIG. 3. This is an open loop.

In Step 430, an offset of the tuning voltage V-tune is determined using an estimated gain K of the VCO.

In Step 440, the tuning voltage, V-tune, is updated.

Steps 420-440 may be repeated any number of times as suitable for the intended purpose. For example, if the VCO gain estimation is inaccurate, it will cause an inaccurate V-tune correction-step. With each loop step, the residual error will decrease exponentially.

In Step 450, loop filter memories (not shown) of the VCO are reset.

In Step 460, the control loop is closed. More specifically, the tuning voltage value K-VCO of the VCO is dynamically updated using a closed control loop with error feedback.

Using multiple iterations, where K>1, is useful in a case of a VCO gain (K-VCO) mismatch. Error in the estimated VCO gain results in a frequency error that is proportional to the tuning voltage value V-tune step size. Using multiple iterations results in a final frequency error proportional to the last tuning voltage value V-tune correction step-size, which, in the last iteration, should be small.

The frequency estimation of this disclosure has many advantages over previous solutions. For example, previous analog counters count a number of VCO/DCO cycles in a predefined time window, but with limited quantization and a long time for high accuracy. Digital phase derivative averaging is simpler, but requires twice as many samples to reach the same accuracy.

The fast frequency estimation in accordance with the present disclosure allows for fast DPLL locking. This faster DPLL locking is important for processes such as band switching and channel scanning, thereby allowing more time for initial calibrations.

A previous solution for fast loop locking is gear-shifting, which involves locking in a closed loop while changing the loop bandwidth. This approach is limited by a loop delay, so there is slower convergence. Also, changing the filter on-the-run is sub-optimal due to un-updated internal memories.

The term "circuit" shall be understood to be circuit(s), processor(s), logic, or a combination thereof. For example, a circuit can include an analog circuit, a digital circuit, state machine logic, other structural electronic hardware, or a combination thereof. In one or more of the exemplary aspects described herein, a circuit can include memory that stores data and/or instructions. The memory can be any well-known volatile and/or non-volatile memory, including, for example, Read Only Memory (ROM), Random Access Memory (RAM), flash memory, a magnetic storage media, an optical disc, erasable programmable read only memory (EPROM), and Programmable Read Only Memory (PROM). The memory can be non-removable, removable, or a combination of both.

The following examples pertain to further embodiments.

Example 1 is a Digital Phase Locked Loop (DPLL), comprising: a Time-to-Digital Converter (TDC) configured generate quantized phase values of a Voltage Controlled Oscillator (VCO) signal; and a frequency estimation circuit configured to receive the quantized phase values, determine wraparound phase of the quantized phase values, and least-squares estimate a frequency based on the quantized phase values and the wraparound phase.

In Example 2, the subject matter of Example 1, wherein the frequency estimation circuit comprises: a phase determination circuit configured to determine an accumulation of the quantized phase values with the wraparound phase.

In Example 3, the subject matter of Example 1, wherein the frequency estimation circuit comprises: a wraparound phase determination circuit configured to determine the wraparound phase of the quantized phase values.

In Example 4, the subject matter of Example 3, wherein the wraparound phase determination circuit comprises a decision circuit configured to determine the wraparound phase by comparing a difference between a current quantized phase value and a previous quantized phase value with an expected frequency.

In Example 5, the subject matter of Example 4, wherein the decision circuit determines wraparound phase in accordance with the following:

$$L_l = \begin{cases} -1, & (\varphi_k - \varphi_{k-1}) - f_{exp} < -P/2 \\ 0, & \text{else} \\ 1, & (\varphi_k - \varphi_{k-1}) - f_{exp} > P/2 \end{cases}, L = \sum_{l=1}^{k} L_l,$$

where L is an accumulated number of phase wraparounds, $\varphi_k$ is the current quantized phase value, $\varphi_{k-1}$, is the previous quantized phase value, $f_{exp}$ is the expected frequency, k is an index number of a phase value, and P is a threshold proportional to a period of the VCO signal.

In Example 6, the subject matter of Example 5, further comprising: an estimated frequency determination circuit configured to determine the estimated frequency by removing the wraparound phase from the quantized phase values.

In Example 7, the subject matter of Example 5, wherein a value of the period used in the wraparound phase determination is an estimate of the period of the VCO signal.

In Example 8, the subject matter of Example 1, wherein the estimated frequency is represented as follows: $\hat{f}=b_2*y_k=b_2*\tilde{y}_k+b_2*(L_k \cdot P)$, where $\hat{f}$ is the estimated frequency, $b_2$ is a predetermined matrix, * is a multiplication operation of a vector by a vector, $y_k$ is a quantized phase value without wraparound phase, $\tilde{y}_k$ is a quantized phase value with wraparound phase, $L_k$ is an accumulated number of phase wraparounds, k is an index number of a phase value, and P is a threshold proportional to a period of the VCO signal.

In Example 9, the subject matter of Example 1, wherein the frequency estimation circuit is configured to estimate the frequency on a quantized phase value-by-quantized phase value basis.

In Example 10, the subject matter of Example 1, wherein the quantized phase values are in units relative to a period of the VCO signal.

Example 11 is a wireless communication device, comprising: a baseband processor comprising the subject matter of Example 1, or a Radio Frequency (RF) front end comprising the subject matter of Example 1.

Example 12 is a method of operating a Digital Phase Locked Loop (DPLL), the comprising: generating, by a Time-to-Digital Converter (TDC) quantized phase values of a Voltage Controlled Oscillator (VCO) signal; determining, by a frequency estimation circuit, wraparound phase of the quantized phase values; and least-squares estimating, by the frequency estimation circuit, a frequency based on the quantized phase values and the wraparound phase.

In Example 13, the subject matter of Example 12, wherein the least-squares estimating comprises: determining, by a phase determination circuit, an accumulation of the quantized phase values with the wraparound phase.

In Example 14, the subject matter of Example 12, wherein the least-squares estimating comprises: determining, by a wraparound phase determination circuit, the wraparound phase of the quantized phase values.

In Example 15, the subject matter of Example 14, wherein the wraparound phase determining comprises: determining, by a decision circuit, the wraparound phase by comparing a difference between a current quantized phase value and a previous quantized phase value with an expected frequency.

In Example 16, the subject matter of Example 15, wherein the determining the wraparound phase is in accordance with the following:

$$L_l = \begin{cases} -1, (\varphi_k - \varphi_{k-1}) - f_{exp} < -P/2 \\ 0, \quad \text{else} \\ 1, (\varphi_k - \varphi_{k-1}) - f_{exp} > P/2 \end{cases}, L = \sum_{l=1}^{k} L_l,$$

where L is an accumulated number of phase wraparounds, $\varphi_k$ is the current quantized phase value, $\varphi_{k-1}$, is the previous quantized phase value, $f_{exp}$ is an expected frequency, k is an index number of a phase value, and P is a threshold proportional to a period of the VCO signal.

In Example 17, the subject matter of Example 12, wherein the least-squares frequency estimating circuit comprises: determining, by an estimated frequency determination circuit, the estimated frequency by removing the wraparound phase from the quantized phase values.

In Example 18, the subject matter of Example 16, wherein a value of the period used in the wraparound phase determination is an estimate of the period of the VCO signal.

In Example 19, the subject matter of Example 12, wherein the estimated frequency is represented as follows: $\hat{f}=b_2*y_k=b_2*\tilde{y}_k+b_2*(L_k \cdot P)$, where $\hat{f}$ is the estimated frequency, $b_2$ is a predetermined matrix, * is a multiplication operation of a vector by a vector, $y_k$ is a quantized phase value without wraparound phase, $\tilde{y}_k$ is a quantized phase value with wraparound phase, $L_k$ is an accumulated number of phase wraparounds, k is an index number of a phase value, and P is a threshold proportional to a period of the VCO signal.

In Example 20, the subject matter of Example 12, wherein the least-squares frequency estimating comprising: estimating the frequency on a quantized phase value-by-quantized phase value basis.

In Example 21, the subject matter of Example 12, wherein the quantized phase values are in units relative to a period of the VCO signal.

Example 22 is a method of fast locking a Digital Phase Locked Loop (DPLL), comprising: setting a constant tuning voltage of a Voltage Controlled Oscillator (VCO) using an open control loop; least-squares estimating a frequency based on quantized phase values and a wraparound phase of a VCO signal; determining a tuning voltage offset of the VCO based on the estimated frequency; and updating the tuning voltage of the VCO to compensate for the tuning voltage offset.

In Example 23, the subject matter of Example 22, after updating the tuning voltage of the VCO, further comprising: resetting filter memories of the VCO; and dynamically updating the tuning voltage of the VCO using a closed control loop.

Example 24 is a Digital Phase Locked Loop (DPLL), comprising: a Time-to-Digital Converter (TDC) configured generate quantized phase values of a Voltage Controlled Oscillator (VCO) signal; and a frequency estimation means for receiving the quantized phase values, determining wraparound phase of the quantized phase values, and least-squares estimating a frequency based on the quantized phase values and the wraparound phase.

In Example 25, the subject matter of Example 24, wherein the frequency estimation means comprises: a phase determination mean for determining an accumulation of the quantized phase values with the wraparound phase.

In Example 26, the subject matter of Example 24, wherein the frequency estimation means comprises: a wraparound phase determination means for determining the wraparound phase of the quantized phase values.

In Example 27, the subject matter of Example 26, wherein the wraparound phase determination means comprises a decision means for determining the wraparound phase by comparing a difference between a current quantized phase value and a previous quantized phase value with an expected frequency.

In Example 28, the subject matter of Example 27, wherein the decision means is further for determining wraparound phase in accordance with the following:

$$L_l = \begin{cases} -1, & (\varphi_k - \varphi_{k-1}) - f_{exp} < -P/2 \\ 0, & \text{else} \\ 1, & (\varphi_k - \varphi_{k-1}) - f_{exp} > P/2 \end{cases}, L = \sum_{l=1}^{k} L_l,$$

where L is an accumulated number of phase wraparounds, $\varphi_k$ is the current quantized phase value, $\varphi_{k-1}$ is the previous quantized phase value, $f_{exp}$ is the expected frequency, k is an index number of a phase value, and P is a threshold proportional to a period of the VCO signal.

In Example 29, the subject matter of Example 28, further comprising: an estimated frequency determination means for determining the estimated frequency by removing the wraparound phase from the quantized phase values.

In Example 30, the subject matter of Example 28, wherein a value of the period used in the wraparound phase determination is an estimate of the period of the VCO signal.

In Example 31, the subject matter of Example 24, wherein the estimated frequency is represented as follows: $\hat{f} = b_2 * y_k = b_2 * \tilde{y}_k + b_2 * (L_k \cdot P)$, where $\hat{f}$ is the estimated frequency, $b_2$ is a predetermined matrix, * is a multiplication operation of a vector by a vector, $y_k$ is a quantized phase value without wraparound phase, $\tilde{y}_k$ is a quantized phase value with wraparound phase, $L_k$ is an accumulated number of phase wraparounds, k is an index number of a phase value, and P is a threshold proportional to a period of the VCO signal.

In Example 32, the subject matter of Example 24, wherein the frequency estimation means is further for estimating the frequency on a quantized phase value-by-quantized phase value basis.

In Example 33, the subject matter of Example 24, wherein the quantized phase values are in units relative to a period of the VCO signal.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

The invention claimed is:

1. A Digital Phase Locked Loop (DPLL), comprising:
a Time-to-Digital Converter (TDC) configured to generate quantized phase values of a Voltage Controlled Oscillator (VCO) signal; and
a frequency estimation circuit configured to receive the quantized phase values, determine a wraparound phase of the quantized phase values, and least-squares estimate a frequency based on the quantized phase values and the wraparound phase.

2. The DPLL of claim 1, wherein the frequency estimation circuit comprises:
a phase determination circuit configured to determine an accumulation of the quantized phase values having the wraparound phase.

3. The DPLL of claim 1, wherein the frequency estimation circuit comprises:
a wraparound phase determination circuit configured to determine the wraparound phase of the quantized phase values.

4. The DPLL of claim 3, wherein the wraparound phase determination circuit comprises a decision circuit configured to determine the wraparound phase by comparing a difference between a current quantized phase value and a previous quantized phase value with an expected frequency.

5. The DPLL of claim 4, wherein the decision circuit determines the wraparound phase in accordance with the following:

$$L_l = \begin{cases} -1, & (\varphi_k - \varphi_{k-1}) - f_{exp} < -P/2 \\ 0, & \text{else} \\ 1, & (\varphi_k - \varphi_{k-1}) - f_{exp} > P/2 \end{cases}, L = \sum_{l=1}^{k} L_l,$$

where L is an accumulated number of phase wraparounds, $\varphi_k$ is the current quantized phase value, $\varphi_{k-1}$ is the previous quantized phase value, $f_{exp}$ is the expected frequency, k is an index number of a phase value, and P is a threshold proportional to a period of the VCO signal.

6. The DPLL of claim 5, wherein the frequency estimation circuit comprises:
an estimated frequency determination circuit configured to determine the least-squares estimated frequency by removing the wraparound phase from the quantized phase values.

7. The DPLL of claim 5, wherein a value of the period used in the wraparound phase determination is an estimate of the period of the VCO signal.

8. The DPLL of claim 1, wherein the estimated frequency is represented as follows:

$$\hat{f} = b_2 * y_k = b_2 * \tilde{y}_k + b_2 * (L_k \cdot P),$$

where $\hat{f}$ is the estimated frequency, $b_2$ is a predetermined matrix, * is a multiplication operation of a vector by a vector, $y_k$ is a quantized phase value without the wraparound phase, $\tilde{y}_k$ is a quantized phase value with the wraparound phase, $L_k$ is an accumulated number of phase wraparounds, k is an index number of a phase value, and P is a threshold proportional to a period of the VCO signal.

9. The DPLL of claim 1, wherein the frequency estimation circuit is configured to estimate the frequency on a quantized phase value-by-quantized phase value basis.

10. The DPLL of claim 1, wherein the quantized phase values are in units relative to a period of the VCO signal.

11. A wireless communication device, comprising:
a baseband processor comprising the DPLL of claim 1, or
a Radio Frequency (RF) front end comprising the DPLL of claim 1.

12. A method of operating a Digital Phase Locked Loop (DPLL), comprising:
generating, by a Time-to-Digital Converter (TDC), quantized phase values of a Voltage Controlled Oscillator (VCO) signal;
determining, by a frequency estimation circuit, a wraparound phase of the quantized phase values; and
least-squares estimating, by the frequency estimation circuit, a frequency based on the quantized phase values and the wraparound phase.

13. The method of claim 12, wherein the least-squares estimating comprises:

determining, by a phase determination circuit, an accumulation of the quantized phase values having the wraparound phase.

14. The method of claim 12, wherein the wraparound phase of the quantized phase values is determined by a wraparound phase determination circuit comprised within the frequency estimation circuit.

15. The method of claim 14, wherein the wraparound phase is determined by a decision circuit comprised within the wraparound phase determination circuit, and by comparing a difference between a current quantized phase value and a previous quantized phase value with an expected frequency.

16. The method of claim 15, wherein the decision circuit determines the wraparound phase is in accordance with the following:

$$L_l = \begin{cases} -1, & (\varphi_k - \varphi_{k-1}) - f_{exp} < -P/2 \\ 0, & \text{else} \\ 1, & (\varphi_k - \varphi_{k-1}) - f_{exp} > P/2 \end{cases}, L = \sum_{l=1}^{k} L_l,$$

where L is an accumulated number of phase wraparounds, $\varphi_k$ is the current quantized phase value, $\varphi_{k-1}$ is the previous quantized phase value, $f_{exp}$ is an expected frequency, k is an index number of a phase value, and P is a threshold proportional to a period of the VCO signal.

17. The method of claim 16, wherein a value of the period used in the wraparound phase determination is an estimate of the period of the VCO signal.

18. The method of claim 12, wherein the least-squares estimating comprises:
determining, by an estimated frequency determination circuit within the frequency estimation circuit, the estimated frequency by removing the wraparound phase from the quantized phase values.

19. The method of claim 12, wherein the estimated frequency is represented as follows:

$$\hat{f} = b_2 * y_k = b_2 * \tilde{y}_k + b_2 * (L_k \cdot P),$$

where $\hat{f}$ is the estimated frequency, $b_2$ is a predetermined matrix, * is a multiplication operation of a vector by a vector, $y_k$ is a quantized phase value without wraparound phase, $\tilde{y}_k$ is a quantized phase value with wraparound phase, $L_k$ is an accumulated number of phase wraparounds, k is an index number of a phase value, and P is a threshold proportional to a period of the VCO signal.

20. The method of claim 12, wherein the least-squares frequency estimating comprises:
estimating the frequency on a quantized phase value-by-quantized phase value basis.

21. The method of claim 12, wherein the quantized phase values are in units relative to a period of the VCO signal.

22. A method of fast locking a Digital Phase Locked Loop (DPLL), comprising:
setting a constant tuning voltage of a Voltage Controlled Oscillator (VCO) using an open control loop;
least-squares estimating a frequency based on quantized phase values and a wraparound phase of a VCO signal;
determining a tuning voltage offset of the VCO based on the estimated frequency; and
updating the tuning voltage of the VCO to compensate for the tuning voltage offset.

23. The method of claim 22, after updating the tuning voltage of the VCO, further comprising:
resetting filter memories of the VCO; and
dynamically updating the tuning voltage of the VCO using a closed control loop.

* * * * *